(12) United States Patent
Su et al.

(10) Patent No.: US 9,082,617 B2
(45) Date of Patent: Jul. 14, 2015

(54) INTEGRATED CIRCUIT AND FABRICATING METHOD THEREOF

(71) Applicant: TAIWAN SEMICONDUCTOR MANUFACTURING CO., LTD., Hsinchu (TW)

(72) Inventors: Po-Yuan Su, Kaohsiung (TW); Hung-Ta Huang, Tainan (TW); Ping-Hao Lin, Tainan (TW); Hung-Che Liao, Tainan (TW); Hung-Yu Chiu, Tainan (TW); Chao-Hsuan Pan, Kaohsiung (TW); Wen-Tsung Chen, Tainan (TW); Chih-Ming Huang, Tainan (TW)

(73) Assignee: TAIWAN SEMICONDUCTOR MANUFACTURING CO., LTD., Hsinchu (TW)

(\*) Notice: Subject to any disclaimer, the term of this patent is extended or adjusted under 35 U.S.C. 154(b) by 0 days.

(21) Appl. No.: 14/109,314

(22) Filed: Dec. 17, 2013

(65) Prior Publication Data

US 2015/0171069 A1    Jun. 18, 2015

(51) Int. Cl.

| H01L 23/60 | (2006.01) |
|---|---|
| H01L 27/02 | (2006.01) |
| H01L 27/06 | (2006.01) |
| H01L 21/8238 | (2006.01) |

(52) U.S. Cl.
CPC .... H01L 27/0255 (2013.01); H01L 21/823892 (2013.01); H01L 27/0629 (2013.01); H01L 27/0262 (2013.01)

(58) Field of Classification Search
CPC ............ H01L 27/0255; H01L 27/0266; H01L 27/0251; H01L 27/0262

USPC .......................................... 257/357; 438/199
See application file for complete search history.

(56) References Cited

U.S. PATENT DOCUMENTS

| 5,182,621 | A  | * | 1/1993  | Hinooka ........................ 257/546 |
|---|---|---|---|---|
| 5,760,445 | A  | * | 6/1998  | Diaz .............................. 257/356 |
| 6,091,114 | A  | * | 7/2000  | Mogul et al. ................... 257/360 |
| 7,196,379 | B2 | * | 3/2007  | Morishita et al. ............. 257/357 |
| 2001/0003369 | A1 | * | 6/2001  | Roche ............................ 257/393 |
| 2003/0094969 | A1 | * | 5/2003  | Tatehara et al. ................. 326/24 |
| 2003/0102514 | A1 | * | 6/2003  | Sato ............................... 257/390 |
| 2003/0174452 | A1 | * | 9/2003  | Chen et al. ...................... 361/56 |
| 2003/0193765 | A1 | * | 10/2003 | Kitano ............................ 361/56 |
| 2003/0205765 | A1 | * | 11/2003 | Masuoka ....................... 257/369 |
| 2004/0065922 | A1 | * | 4/2004  | Wang ............................. 257/355 |
| 2009/0278204 | A1 | * | 11/2009 | Morino et al. ................. 257/356 |
| 2011/0291194 | A1 | * | 12/2011 | Kim ............................... 257/355 |
| 2012/0153437 | A1 | * | 6/2012  | Chen et al. ..................... 257/546 |
| 2012/0250198 | A1 | * | 10/2012 | Sudo ............................... 361/56 |
| 2012/0306013 | A1 | * | 12/2012 | Donovan et al. .............. 257/338 |

\* cited by examiner

*Primary Examiner* — Steven J Fulk
(74) *Attorney, Agent, or Firm* — McDermott Will & Emery LLP

(57) ABSTRACT

An integrated circuit and a method of fabricating the integrated circuit are provided. In various embodiments, the integrated circuit includes a semiconductor substrate, at least one deep n-well in the semiconductor substrate, at least one p-channel metal-oxide-semiconductor transistor in the deep n-well, at least one n-channel metal-oxide-semiconductor transistor outside of the deep n-well, an first interconnect structure, and a protection component. Both of the p-channel metal-oxide-semiconductor transistor and the n-channel metal-oxide-semiconductor transistor are disposed in the semiconductor substrate, and are electrically coupled by the first interconnect structure. The protection component is disposed in the semiconductor substrate, wherein the protection component is electrically coupled to the deep n-well.

20 Claims, 3 Drawing Sheets

INTEGRATED CIRCUIT AND FABRICATING METHOD THEREOF

BACKGROUND

Manufacturing of an integrated circuit has been largely driven by the need to increase the density of the integrated circuit formed in a semiconductor device. This is typically accomplished by implementing more aggressive design rules to allow larger density of the integrated circuit to be formed.

The increased density of the integrated circuit, which is combined various types of devices such as logic and radio frequency processing circuits, have generally increased the amount of noise in various circuits of the devices. Noise can be detrimental in the integrated circuit because the integrity of the signal can be compromised, which can in turn cause a loss of data or errors in logic or signal processing. Therefore, some devices in the integrated circuit are formed in a deep doped well to isolate the noise. The doped well is typically able to reduce noise between other devices in a semiconductor substrate and devices in the doped well by providing a low resistance path for the noise to travel to a ground node rather than affect devices in the doped well.

However, in manufacturing the integrated circuits, various dielectric layers are also required to be formed on the semiconductor substrate. The dielectric layers are etched to form openings for metallization layers. Plasma etching processes are commonly applied for etching these openings. Therefore, charges of these plasma etching processes can be accumulated in the deep doped well. These accumulated charges in the deep doped well could transfer and damage the devices which have conductive path to the deep doped well. It results that performance of the damaged devices would be inconsistent and uncontrollable. Accordingly, improvements in integrated circuits and fabricating methods thereof continue to be sought.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a," "an" and "the" used herein include plural referents unless the context clearly dictates otherwise. Therefore, reference to, for example, a liner layer includes embodiments having two or more such liner layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

In conventional integrated circuit, charges of plasma etching processes would be accumulated in the deep doped well, and those accumulated charges in the deep doped well could transfer and damage the devices, which are electrically connected to the deep doped well. Therefore, performance of the damaged devices would be inconsistent and uncontrollable and the yield in fabricating the integrated circuit could be reduced. In this regard, integrated circuits and methods of fabricating the integrated circuits are provided according to various embodiments of the present disclosure.

Figure 1:
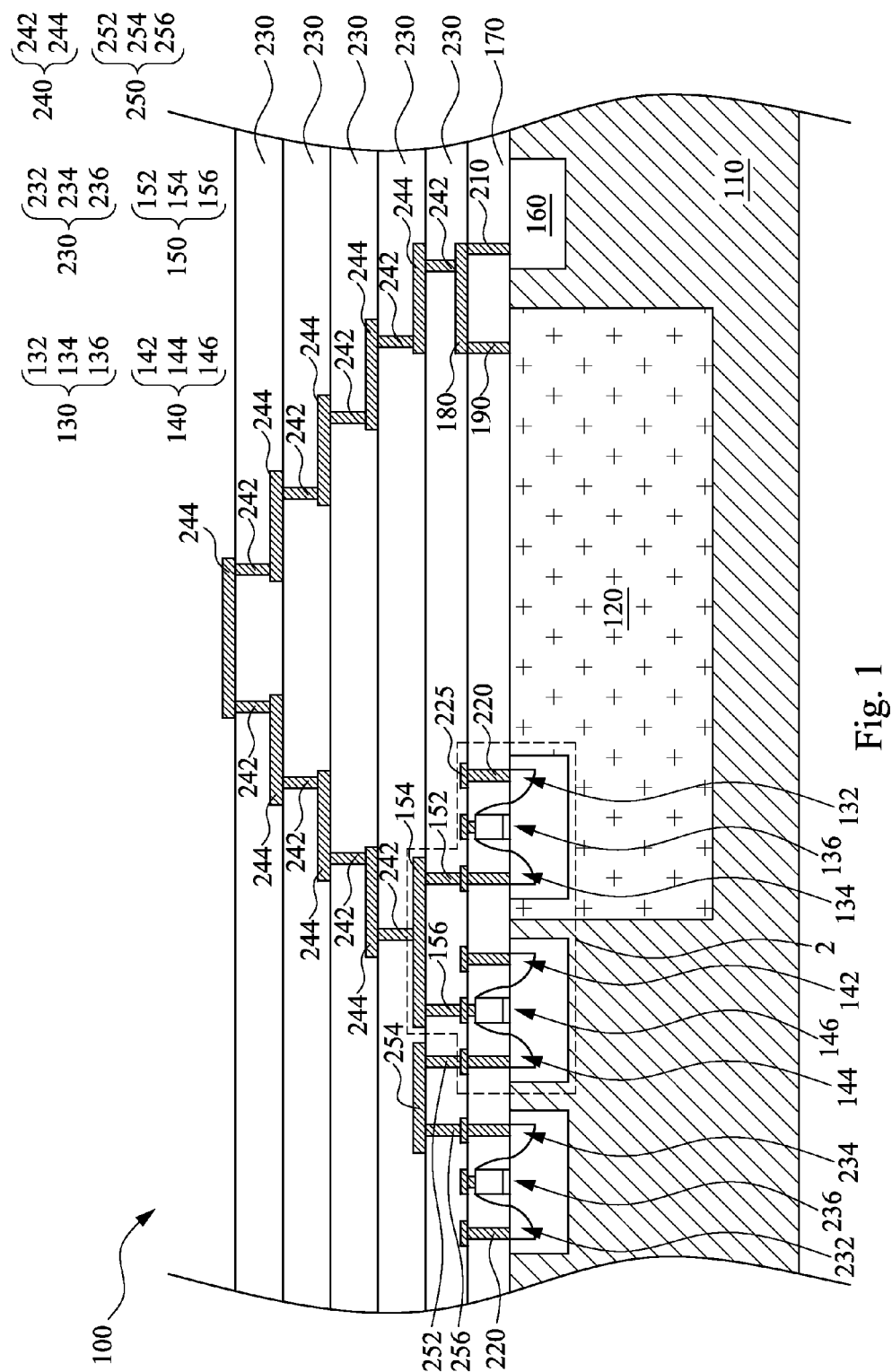
FIG. 1 is a schematic cross-sectional view illustrating an integrated circuit according to various embodiments of the present disclosure.

FIG. 1 is a schematic cross-sectional view illustrating an integrated circuit according to various embodiments of the present disclosure. As illustrated in FIG. 1, the integrated circuit 100 includes a semiconductor substrate 110, at least one deep n-well 120, at least one p-channel metal-oxide-semiconductor transistor 130, at least one n-channel metal-oxide-semiconductor transistor 140, an first interconnect structure 150, and a protection component 160. The semiconductor substrate 110 may be a silicon substrate, a III-V compound substrate, a silicon/germanium (SiGe) substrate, a silicon-on-insulator (SOI) substrate. The deep n-well 120 is disposed in the semiconductor substrate 110. The deep n-well 120 can be utilized to isolate noises from different devices in the semiconductor substrate 110 and further reduce noise coupling. The deep of the deep n-well 120 refers to doped wells that are located lower (or deeper into the semiconductor substrate 110) than the doped wells surrounding transistors and/or other devices. The deep n-well 120 is typically able to reduce noise between other devices in the semiconductor substrate 110 and devices in the deep n-well 120 by providing a low resistance path for the noise to travel to a ground node rather than affect devices in the deep doped well. Especially for high-speed applications which are susceptible to noise interference. Therefore, such devices may employ the deep n-well 120 for noise reduction.

Referring to FIG. 1, the p-channel metal-oxide-semiconductor transistor 130 is disposed in the deep n-well 120. As illustrated in FIG. 1, the P-channel metal-oxide-semiconductor transistor 130 has a source electrode 132, a drain electrode 134, and a gate electrode 136. The source electrode 132, the drain electrode 134, and the gate electrode 136 may be respectively electrically connected to contacts 220 disposed in an inter-layer dielectric 170 as shown in FIG. 1. The contacts 220 may be aluminum (Al), tungsten (W), copper (Cu), or other suitable metal material deposited by CVD, PVD, electrochemical plating (ECP), or other suitable processes. The inter-layer dielectric layer 170 may be silicon dioxide (SiO$_2$) formed by a suitable process, such as CVD, PVD, ALD, HDPCVD, MOCVD, RPCVD, PECVD, PLD, other suitable techniques, or combinations thereof. However, the present disclosure is not limited thereto. The n-channel metal-oxide-semiconductor transistor 140 is disposed in the semiconductor substrate 110 and outside of the deep n-well 120. The n-channel metal-oxide-semiconductor transistor 140 also has a source electrode 142, a drain electrode 144, and a gate electrode 146. The source electrode 142, the drain electrode 144, and the gate electrode 146 may also be respectively electrically connected to contacts 220 disposed in the inter-layer dielectric 170 as shown in FIG. 1. The first interconnect structure 150 is electrically coupled to the p-channel metal-oxide-semiconductor transistor 130 and the n-channel metal-oxide-semiconductor transistor 140. The first interconnect structure 150 may include multiple layer of metals. For example, the first interconnect structure 150 may includes a conductive pad 154 and two vias 152, 156 as illustrated in FIG. 1. The conductive pad 154 and the vias 152, 156 may be aluminum (Al), tungsten (W), copper (Cu), or other suitable metal material deposited by CVD, PVD, electrochemical plating (ECP), or other suitable process. The via 152 is disposed in an inter-metal dielectric layer 230 and electrically connected to the contact 220, which is electrically connected to the drain electrode 134 of the p-channel metal-oxide-semiconductor transistor 130. The inter-metal dielectric layer 230 may be silicon dioxide (SiO$_2$), or a low-k dielectric material or a ultra low k material, such as borophosphosilicate glass (BPSG), borosilicate glass (BSG), phosphosilicate glass (PSG), fluorinated silica glass (FSG), SiLK, BLACK DIAMOND, and the like. The via 156 is disposed in the inter-metal dielectric layer 230 and electrically connected to the contact 220, which is electrically connected to the gate electrode 146 of the n-channel metal-oxide-semiconductor transistor 140. Both of the vias 152 and 156 are electrically connected the conductive pad 154. Therefore, the drain electrode 134 of the p-channel metal-oxide-semiconductor transistor 130 and the gate electrode 146 of the n-channel metal-oxide-semiconductor transistor 140 are electrically connected by the interconnect structure 150. However, the present disclosure is not limited to it. The first interconnect structure 150 may include more conductive pads and vias to construct a structure with more layer of metals and electrically connect the p-channel metal-oxide-semiconductor transistor 130 disposed in the deep n-well 120 and the n-channel metal-oxide-semiconductor transistor 140 outside of the deep n-well 120.

Figure 2:
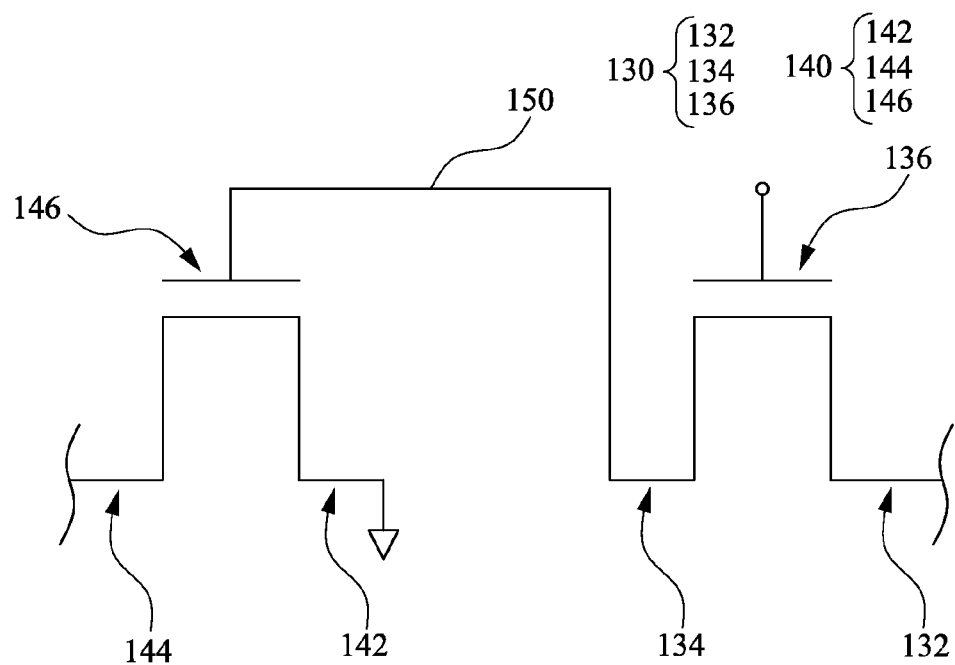
FIG. 2 is an equivalent circuit diagram of a portion of the integrated circuit illustrated in FIG. 1.

FIG. 2 is an equivalent circuit diagram of a portion of the integrated circuit 100 illustrated in FIG. 1. The portion is dash line marked region in FIG. 1. Referring to FIG. 2 and FIG. 1, in various embodiments of the present disclosure, the first interconnect structure 150 connects the drain electrode 134 of the p-channel metal-oxide-semiconductor transistor 130 and the gate electrode 146 of the n-channel metal-oxide-semiconductor transistor 140. As shown in FIG. 2, the drain electrode 134 of the p-channel metal-oxide-semiconductor transistor 130 is electrically connected to the gate electrode 146 of the through the interconnect structure 150. Therefore, the p-channel metal-oxide-semiconductor transistor 130 in the deep n-well 120 is electrically connected to the n-channel metal-oxide-semiconductor transistor 140 outside of the deep n-well 120. Besides, the source electrode 132 of the p-channel metal-oxide-semiconductor transistor 130 in the deep n-well 120 may be electrically connected to a positive power supply (not shown) through the contact 220 and a first metal pad 225 (shown in FIG. 1); the gate electrode 136 of the p-channel metal-oxide-semiconductor transistor 130 in the deep n-well 120 may be electrically connected to a signal source through another contact 220 and another first metal pad 225 (shown in FIG. 1); the source electrode 142 of the n-channel metal-oxide-semiconductor transistor 140 may be electrically connected to a ground; the drain electrode 144 of the n-channel metal-oxide-semiconductor transistor 140 may be electrically connected to a power source or another p-channel metal-oxide-semiconductor transistor, which is outside of the deep n-well 120. The first metal pad 225 may be aluminum (Al), tungsten (W), copper (Cu), or other suitable metal material deposited by CVD, PVD, electrochemical plating (ECP), or other suitable process.

Referring to FIG. 1, while manufacturing the integrated circuit 100, various plasma processes may be used in fabricating devices, such as the p-channel metal-oxide-semiconductor transistor 130 and the n-channel metal-oxide-semiconductor transistor 140, and the first interconnect structure 150 for electrically connecting these devices. Plasma processes used in manufacturing devices may include reactive ion etch used for removing materials on the semiconductor substrate 110, plasma-enhanced deposition for depositing films such as the inter-layer dielectric layer 170, ion implantation for forming doped regions, and physical vapor deposition for depositing conductive materials. In other words, a high-density plasma deposition may be used to deposit the inter-layer dielectric layer 170 or inter-metal dielectric layers 230. On the other hand, physical vapor deposition that utilizes plasma discharge to sputter conductive materials off targets for depositing conductive particles on the semiconductor substrate 110 to form contacts 220 in the inter-layer dielectric layer 170, and vias 152, 156, 252, 254, and 240 in the inter-metal dielectric layers 230 as illustrated in FIG. 1. Plasma ions may directly contact a surface of the semiconductor substrate 110 and the plasma ions may be implanted into the semiconductor substrate 110. On the other hand, plasma ions may be indirectly transferred the semiconductor substrate 110. For example, plasma ions may be utilized for etching process, such as reactive ion etching process, to form openings or patterns in or on the semiconductor substrate 110. The openings generally extend to some underlying conductive feature, and the plasma used for the plasma process is able to contact the conductive feature and be transported into the substrate. In structures having devices having doped wells, charges from the plasma can be transferred through the conductive feature to the doped wells. During various processing operations, ions from process plasma may be transfer to the deep n-well 120 formed under devices structures.

As aforementioned, many manufacturing processes involve plasma ions. If the semiconductor substrate 110 is not grounded properly, ions in the plasma could accumulate in various layers in and/or on the semiconductor substrate 110. Especially for reactive ion etching process the semiconductor substrate 110 is biased to attract positive etching ions to increase ion energy and etch rate. Therefore, positive plasma ions are accumulated and/or on the semiconductor substrate 110, especially in the deep n-well 120 if the semiconductor substrate 110 is not well grounded. As illustrated in FIG. 1, since the region of the deep n-well 120 is relatively large, charges (positive plasma ions) accumulated in the deep n-well 120 could be fairly significant. The charges accumulated in the deep n-well 120 could be caused by one or more plasma relating processes, such as etching, film deposition, and ion implant.

As shown in FIG. 1, since the first interconnect structure 150 is electrically coupled to the n-channel metal-oxide-semiconductor transistor 140 (which is outside of the deep n-well 120) and the p-channel metal-oxide-semiconductor transistor 130 (which is disposed in the deep n-well 120), the positive ions accumulated in the deep n-well 120 could flow from the p-channel metal-oxide-semiconductor transistor 130 to the n-channel metal-oxide-semiconductor transistor 140. It results in the risk of damaging the n-channel metal-oxide-semiconductor transistor 140, which is outside of the deep n-well 120), is increased. In various embodiments of the present disclosure, the first interconnect structure 150 connects the drain electrode 134 of the p-channel metal-oxide-semiconductor transistor 130 and the gate electrode 146 of the n-channel metal-oxide-semiconductor transistor 140. Therefore, the positive ions accumulated in the deep n-well 120 could flow from the drain electrode 134 of the p-channel metal-oxide-semiconductor transistor 130 to the gate electrode 146 of the n-channel metal-oxide-semiconductor transistor 140 due to a voltage drop. Those positive ions could damage or breakdown a gate dielectric layer of the gate electrode 146 of the n-channel metal-oxide-semiconductor transistor 140. Therefore, performance of the n-channel metal-oxide-semiconductor transistor 140 would be inconsistent and uncontrollable because of damaged gate electrode 146 of the n-channel metal-oxide-semiconductor transistor 140. Accordingly, the positive ions accumulated in the deep n-well 120 would degrade a yield of the n-channel metal-oxide-semiconductor transistor 140.

Referring to FIG. 1, it should be noticed that the protection component 160 is disposed in the semiconductor substrate 110. The protection component 160 is electrically coupled to the deep n-well 120. Therefore, the positive ions accumulated in the deep n-well 120 would be conducted and transferred into the protection component 160 instead of flowing into the n-channel metal-oxide-semiconductor transistor 140. Therefore, the risk of damaging the n-channel metal-oxide-semiconductor transistor 140 as aforementioned can be significantly reduced. As illustrated in FIG. 1, in various embodiments of the present disclosure, the integrated circuit 100 further includes an inter-layer dielectric layer 170, a conductive pad 180, at least one deep n-well contact 190, and at least one protection component contact 210. The inter-layer dielectric layer 170 is covering the semiconductor substrate 110, the deep n-well 120, the p-channel metal-oxide-semiconductor transistor 130, the n-channel metal-oxide-semiconductor transistors 140, and the protection component 160. The conductive pad 180 is dispose on the inter-layer dielectric layer 170. The deep n-well contact 190 is disposed in the inter-layer dielectric layer 170 and the deep n-well contact 190 is connected to the deep n-well 120. The protection component contact 210 is disposed in the inter-layer dielectric layer 170 and the protection component contact 210 is connected to the protection component 160. Both of the deep n-well contact 190 and the protection component contact 210 are electrically connected to the conductive pad 180 such that the protection component 160 is electrically coupled to the deep n-well 120. In other words, since the deep n-well contact 190 is directly electrically connected to the deep n-well 120, the positive ions accumulated in the deep n-well 120 would be transferred into the deep n-well contact 190, the conductive pad 180, the protection component contact 210, and finally flow into the protection component 160. Therefore, the positive ions accumulated in the deep n-well 120 would not flow into and damage the n-channel metal-oxide-semiconductor transistors 140. As aforementioned, in various embodiments of the present disclosure, even when the drain electrode 134 of the p-channel metal-oxide-semiconductor transistor 130 is electrically connected to the gate electrode 146 of the n-channel metal-oxide-semiconductor transistor 140 by the interconnect structure 150, the positive ions accumulated in the deep n-well 120 would not flow into the gate electrode 146 of the n-channel metal-oxide-semiconductor transistor 140 because the positive ions are dissipated and flow into the protection component 160. In various embodiments of the present disclosure, the protection component 160 includes a reverse-biased diode. The reverse-biased diode may be a n-type diode to attract the positive ions accumulated in the deep n-well 120. A breakdown voltage of the n-type diode is lower than a breakdown voltage of the gate electrode 146 of the n-channel metal-oxide-semiconductor transistor 140. Therefore, the n-type diode can be regarded as a protector for the n-channel metal-oxide-semiconductor transistors 140. In other various embodiments of the present disclosure, the protection component 160 includes a circuit. The circuit may be fabricated in the semiconductor substrate 110, and conduct the positive ions accumulated in the deep n-well 120 away to avoid damaging n-channel metal-oxide-semiconductor transistors 140. As illustrated in FIG. 1, in various embodiments of the present disclosure, the deep n-well 120 is disposed between the protection component 160 and the n-channel metal-oxide-semiconductor transistor 140. In other words, the protection component 160 is not sandwiched by the deep n-well 120 and the n-channel metal-oxide-semiconductor transistor 140, but disposed in the other side of the deep n-well 120 and relatively away from the n-channel metal-oxide-semiconductor transistor 140. Therefore, the protection component 160 would not interfere the signals/current flows of the n-channel metal-oxide-semiconductor transistor 140. In addition, the design of layout for adding the protection component 160 could be more flexible since predetermined distance between the deep n-well 120 and the n-channel metal-oxide-semiconductor transistor 140 will not be affected by newly added protection component 160. Also illustrated in FIG. 1, in various embodiments of the present disclosure, the integrated circuit 100 further includes a second interconnect structure 240. The second interconnect structure 240 is electrically connected to the first interconnect structure 150 and the protection component 160. The second interconnect structure 240 may include multiple layer of metals having a plurality of vias 242 and a plurality of metal pads 260. The metal pads 260 may respectively disposed in the same or different layers, for example, from the second metal layer (M2) to the sixth metal layer (M6), and the metal pads 260 are respectively electrically connected by the plurality of vias 242. As shown in FIG. 1, one of the plurality of vias 242 of the second interconnect structure 240 is electrically connected to the conductive pad 154 of the first interconnect structure 150, and another one of the plurality of vias 242 of the second interconnect structure 240 is electrically connected to the conductive pad 180 which is electrically connected to the protection component 160. Therefore, the risk of damaging the n-channel metal-oxide-semiconductor transistor 140 would be further reduced since the conductive path between the deep n-well 120 and the n-channel metal-oxide-semiconductor transistor 140 is grafted by the second interconnect structure 240. As illustrated in FIG. 1, in other various embodiment of the present disclosure, the integrated circuit 100 may further include another p-channel metal-oxide-semiconductor transistor 230 as a second p-channel metal-oxide-semiconductor transistor (the p-channel metal-oxide-semiconductor transistor 130 disposed in the deep n-well 120 as a first p-channel metal-oxide-semiconductor transistor), and the third interconnect structure 250. The second p-channel metal-oxide-semiconductor transistor 230 is disposed in the semiconductor substrate 110 and outside of the deep n-well 120. The third interconnect structure 250 is electrically coupled to the n-channel metal-oxide-semiconductor transistor 140 and the second p-channel metal-oxide-semiconductor transistor 230. The second p-channel metal-oxide-semiconductor transistor 230 is electrically connected to the n-channel metal-oxide-semiconductor transistor 140 through the third interconnect structure 250. The second p-channel metal-oxide-semiconductor transistor 230 and the n-channel metal-oxide-semiconductor transistor 140 can be regarded as a device with both p-channel metal-oxide-semiconductor transistor and the n-channel metal-oxide-semiconductor transistor, for example, an inverter. In various embodiments of the present disclosure, the third interconnect structure 250 connects a drain electrode 234 of the second p-channel metal-oxide-semiconductor transistor 230 and a drain 144 electrode of the n-channel metal-oxide-semiconductor transistor 140. As illustrated in FIG. 1, the third interconnect structure 250 may include a conductive pad 254 and vias 252, 256. The via 252 is disposed in the inter-metal dielectric layer 230 and electrically connected to the contact 220, which is electrically connected to the drain electrode 144 of the n-channel metal-oxide-semiconductor transistor 140. The via 256 is disposed in the inter-metal dielectric layer 230 and electrically connected to the contact 220, which is electrically connected to the drain electrode 234 of the second p-channel metal-oxide-semiconductor transistor 230. Both of the vias 252 and 256 are electrically connected the conductive pad 254. Therefore, the drain electrode 144 of the n-channel metal-oxide-semiconductor transistor 140 and the drain electrode 234 of the second p-channel metal-oxide-semiconductor transistor 230 are electrically connected by the third interconnect structure 250.

Figure 3:
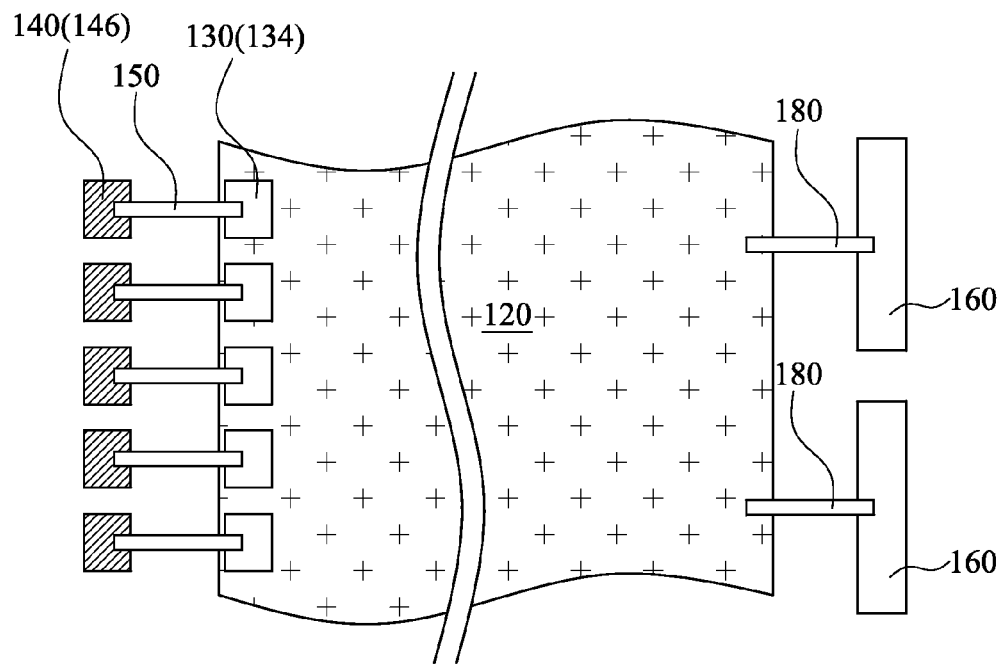
FIG. 3 is a schematic top-view of a portion of the integrated circuit illustrated in FIG. 1.

FIG. 3 is a schematic top-view of a portion of the integrated circuit 100 illustrated in FIG. 1. As aforementioned, positive plasma ions accumulated in the deep n-well 120 because the deep n-well 120 region is exposed to plasma sources during various processes during manufacturing. The plasma sources can come from front-end-of-line (FEOL) plasma processes and back-end-of-line (BEOL) plasma processes, such as film deposition, etching, and implantation. Devices surrounding the deep n-well 120, such as the n-channel metal-oxide-semiconductor transistor 140, may be damaged by positive ions from the deep n-well 120. As illustrated in FIG. 3, when the first interconnect structure 150 between the n-channel metal-oxide-semiconductor transistor 140 (outside of the deep n-well 120) and the p-channel metal-oxide-semiconductor transistor 130 (in the deep n-well 120) is formed, accumulated positive plasma ions in the deep n-well 120 could flow toward the n-channel metal-oxide-semiconductor transistor 140 through the p-channel metal-oxide-semiconductor transistor 130. The n-channel metal-oxide-semiconductor transistor 140 may be damaged by the positive plasma ions. For example, the positive plasma ions may flow through the gate electrode 146 of the n-channel metal-oxide-semiconductor transistor 140 and damage the gate electrode 146. As mentioned above, damage in the gate electrode 146 would lead the performance of n-channel metal-oxide-semiconductor transistor 140 inconsistent and uncontrollable. As a result, a yield of a chip including the damaged gate dielectric 146 would be reduced. The risk of damaging the n-channel metal-oxide-semiconductor transistor 140 increases when an area of the deep n-well 120 is larger. Especially when a ratio of the area of the deep n-well 120 to an area of the gate electrode 146 of the n-channel metal-oxide-semiconductor transistor 140 is greater, above issue could be very serious. Therefore, the protection component 160, which is electrically coupled to the deep n-well 120, are formed to offer another conductive path for the accumulated positive plasma ions in the deep n-well 120. As shown in FIG. 3, the accumulated positive plasma ions in the deep n-well 120 could flow into the protection component 160 through the conductive pad 180 as aforementioned such that the n-channel metal-oxide-semiconductor transistor 140 is protected. Accordingly, the ratio of the area of the deep n-well 120 to the area of the gate electrode 146 of the n-channel metal-oxide-semiconductor transistor 140 could be relatively larger, and more flexibility of circuit layout design is obtained. In various embodiments of the present disclosure, the ratio of the area of the deep n-well 120 to the area of the gate electrode 146 of the n-channel metal-oxide-semiconductor transistor 140 is in a range of $5 \times 10^5$ to $1 \times 10^7$. While manufacturing an integrated circuit, the ratio of the area of the deep n-well 120 to the area of the gate electrode 146 of the n-channel metal-oxide-semiconductor transistor 140 could be calculated and checked by predetermined layout of them. If the ratio is greater than $5 \times 10^5$, an extra mask for manufacturing the protection component 160 electrically coupled to the deep n-well 120 can be added to avoid aforementioned issues.

Figure 4:
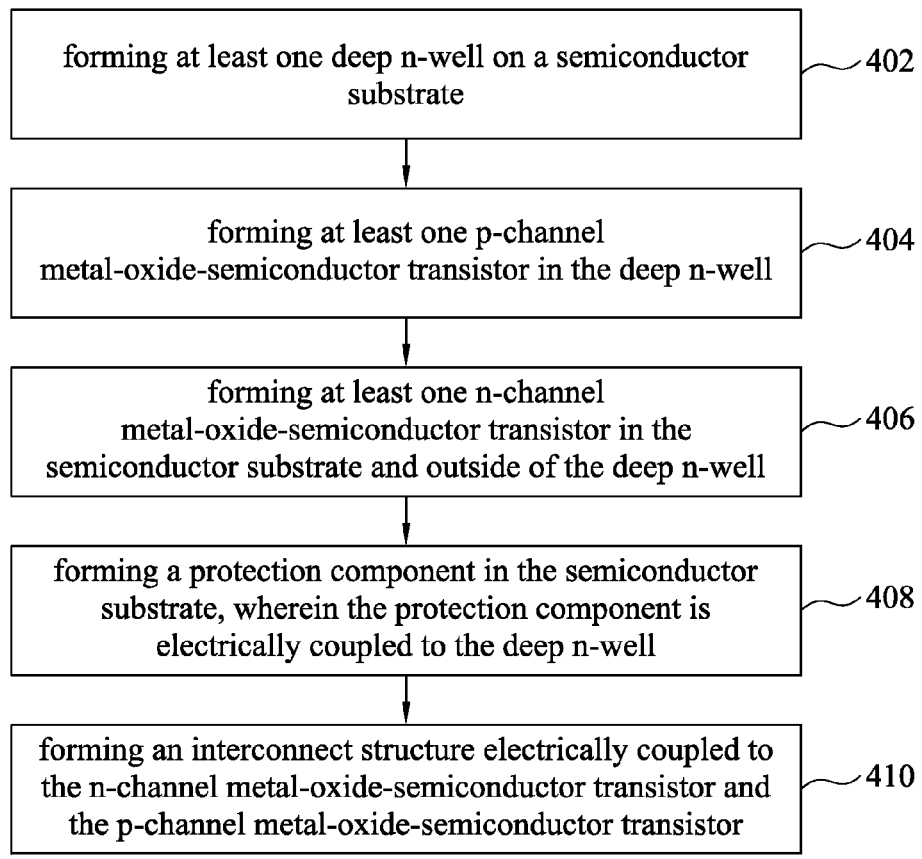
FIG. 4 is a flowchart illustrating a method of fabricating an integrated circuit according to various embodiments of the present disclosure.

FIG. 4 is a flowchart illustrating a method 400 of fabricating an integrated circuit according to various embodiments of the present disclosure. The method 400 begins with block 402 in which at least one deep n-well on a semiconductor substrate is formed. The method 400 continues with block 404 in which at least one p-channel metal-oxide-semiconductor transistor in the deep n-well is formed. The method 400 also includes forming at least one n-channel metal-oxide-semiconductor transistor in the semiconductor substrate and outside of the deep n-well as shown in block 406, and forming a protection component in the semiconductor substrate as shown in block 408. The protection component is electrically coupled to the deep n-well. It should be noticed that the formation of the p-channel metal-oxide-semiconductor transistor (block 404), the formation of the n-channel metal-oxide-semiconductor transistor (block 406), and the formation of the protection component (block 408) can be performed in any sequence since the p-channel metal-oxide-semiconductor transistor, the n-channel metal-oxide-semiconductor transistor, and the protection component are at the same level (in the semiconductor substrate). In various embodiments of the present disclosure, the protection component includes a reverse-biased diode, a circuit, or a combination thereof. The conductive path of the protection component and the deep n-well may be constructed by forming an inter-layer dielectric layer covering the semiconductor substrate, the deep n-well, the p-channel metal-oxide-semiconductor transistor, the n-channel metal-oxide-semiconductor transistors, and the protection component. And a conductive pad is formed and disposed on the inter-layer dielectric layer. At least one deep n-well contact is formed and disposed in the inter-layer dielectric layer and connected to the deep n-well; at least one protection component contact is formed and disposed in the inter-layer dielectric layer and connected to the protection component. Both of the deep n-well contact and the protection component contact are electrically connected to the conductive pad such that the protection component is electrically coupled to the deep n-well. Next, the method 400 includes forming an interconnect structure electrically coupled to the n-channel metal-oxide-semiconductor transistor and the p-channel metal-oxide-semiconductor transistor as shown in block 506.

In summary, according to various embodiments of the present disclosure, the deep n-well is electrically connected to the protection component, and therefore the positive ions accumulated in the deep n-well would be transferred into the protection component. Therefore, the positive ions accumulated in the deep n-well would not flow into and damage the n-channel metal-oxide-semiconductor transistors, which is electrically connected to the p-channel metal-oxide-semiconductor transistors in the deep n-well. Accordingly, the yield of manufacturing the integrated circuit can be significantly increased. Besides, the protection component is not sandwiched by the deep n-well and the n-channel metal-oxide-semiconductor transistor, but disposed in the other side of the deep n-well. Therefore, the protection component would not interfere the signals/current flows of the n-channel metal-oxide-semiconductor transistor. Furthermore, the design of layout for adding the protection component could be more flexible since distance between the deep n-well and the n-channel metal-oxide-semiconductor transistor will not be affected by newly added protection component.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit, comprising:
    a semiconductor substrate;
    at least one deep n-well disposed in the semiconductor substrate;
    at least one p-channel metal-oxide-semiconductor transistor disposed in the deep n-well;
    at least one n-channel metal-oxide-semiconductor transistor disposed in the semiconductor substrate and outside of the deep n-well;
    a first interconnect structure electrically coupled to the n-channel metal-oxide-semiconductor transistor and the p-channel metal-oxide-semiconductor transistor; and
    a protection component disposed in the semiconductor substrate and outside of the deep n-well, wherein the protection component is electrically coupled to the deep n-well, and the protection component and the n-channel metal-oxide-semiconductor transistor being at opposite sides of the deep n-well.

2. The integrated circuit of claim 1, wherein the first interconnect structure connects a drain electrode of the p-channel metal-oxide-semiconductor transistor and a gate electrode of the n-channel metal-oxide-semiconductor transistor.

3. The integrated circuit of claim 2, wherein a ratio of an area of the deep n-well to an area of the gate electrode of the n-channel metal-oxide-semiconductor transistor is in a range of $5 \times 10^5$ to $1 \times 10^7$.

4. The integrated circuit of claim 1, further comprising:
    an inter-layer dielectric layer covering the semiconductor substrate, the deep n-well, the p-channel metal-oxide-semiconductor transistor, the n-channel metal-oxide-semiconductor transistors, and the protection component;
    a conductive pad dispose on the inter-layer dielectric layer;
    at least one deep n-well contact disposed in the inter-layer dielectric layer and connected to the deep n-well; and
    at least one protection component contact disposed in the inter-layer dielectric layer and connected to the protection component,
    wherein both of the deep n-well contact and the protection component contact are electrically connected to the conductive pad such that the protection component is electrically coupled to the deep n-well.

5. The integrated circuit of claim 1, wherein the deep n-well is disposed between the protection component and the n-channel metal-oxide-semiconductor transistor.

6. The integrated circuit of claim 1, wherein the protection component comprises a reverse-biased diode.

7. The integrated circuit of claim 6, wherein the reverse-biased diode is an n-type diode.

8. The integrated circuit of claim 7, wherein a breakdown voltage of the n-type diode is lower than a breakdown voltage of the gate electrode of the n-channel metal-oxide-semiconductor transistor.

9. The integrated circuit of claim 1, wherein the protection component comprises a circuit.

10. The integrated circuit of claim 1, further comprising:
    a second interconnect structure electrically connected to the first interconnect structure and the protection component.

11. The integrated circuit of claim 10, the second interconnect structure comprises multiple layer of metals.

12. An integrated circuit, comprising:
    a semiconductor substrate;
    a deep n-well disposed in the semiconductor substrate;
    a first p-channel metal-oxide-semiconductor transistor disposed in the deep n-well;
    a second p-channel metal-oxide-semiconductor transistor disposed in the semiconductor substrate and outside of the deep n-well;
    an n-channel metal-oxide-semiconductor transistors disposed in the semiconductor substrate and outside of the deep n-well;
    a first interconnect structure electrically coupled to the n-channel metal-oxide-semiconductor transistor and the first p-channel metal-oxide-semiconductor transistor;
    a third interconnect structure electrically coupled to the n-channel metal-oxide-semiconductor transistor and the second p-channel metal-oxide-semiconductor transistor; and
    a protection component disposed in the semiconductor substrate and outside of the deep n-well, wherein the protection component is electrically coupled to the deep n-well, and the protection component and the n-channel metal-oxide-semiconductor transistor being at opposite sides of the deep n-well.

13. The integrated circuit of claim 12, wherein the first interconnect structure connects a drain electrode of the first p-channel metal-oxide-semiconductor transistor and a gate electrode of the n-channel metal-oxide-semiconductor transistor.

14. The integrated circuit of claim 12, wherein the third interconnect structure connects a drain electrode of the second p-channel metal-oxide-semiconductor transistor and a drain electrode of the n-channel metal-oxide-semiconductor transistor.

15. The integrated circuit of claim 12, wherein a ratio of an area of the deep n-well to an area of the gate electrodes of the n-channel metal-oxide-semiconductor transistors is in a range of $5 \times 10^5$ to $1 \times 10^7$.

16. The integrated circuit of claim 12, further comprising:
    an inter-layer dielectric layer covering the semiconductor substrate, the deep n-well, the first p-channel metaloxide-semiconductor transistor, the second p-channel metal-oxide-semiconductor transistor, the n-channel metal-oxide-semiconductor transistors, and the protection component;

a conductive pad disposed on the inter-layer dielectric layer;

at least one deep n-well contact disposed in the inter-layer dielectric layer and connected to the deep n-well; and at least one protection component contact disposed in the inter-layer dielectric layer and connected to the protection component, wherein both of the deep n-well contact and the protection component contact are electrically connected to the conductive pad such that the protection component is electrically coupled to the deep n-well.

17. The integrated circuit of claim 12, wherein the protection component comprises a reverse-biased diode, a circuit, or a combination thereof.

18. A method of fabricating an integrated circuit, comprising:

forming at least one deep n-well on a semiconductor substrate;

forming at least one p-channel metal-oxide-semiconductor transistor in the deep n-well;

forming at least one n-channel metal-oxide-semiconductor transistor in the semiconductor substrate and outside of the deep n-well;

forming a protection component in the semiconductor substrate and outside of the deep n-well, wherein the protection component is electrically coupled to the deep n-well, and the protection component and the n-channel metal-oxide-semiconductor transistor being at opposite sides of the deep n-well; and forming an interconnect structure electrically coupled to the n-channel metal-oxide-semiconductor transistor and the p-channel metal-oxide-semiconductor transistor.

19. The method of claim 18, wherein the protection component comprises a reverse-biased diode, a circuit, or a combination thereof.

20. The method of claim 18, further comprising:

forming an inter-layer dielectric layer covering the semiconductor substrate, the deep n-well, the p-channel metal-oxide-semiconductor transistor, the n-channel metal-oxide-semiconductor transistors, and the protection component;

forming a conductive pad disposed on the inter-layer dielectric layer;

forming at least one deep n-well contact disposed in the inter-layer dielectric layer and connected to the deep n-well; and forming at least one protection component contact disposed in the inter-layer dielectric layer and connected to the protection component, wherein both of the deep n-well contact and the protection component contact are electrically connected to the conductive pad such that the protection component is electrically coupled to the deep n-well.

* * * * *